United States Patent
Lee et al.

(10) Patent No.: US 12,040,024 B2
(45) Date of Patent: Jul. 16, 2024

(54) FLASH MEMORY AND ERASE METHOD THEREOF

(71) Applicant: MACRONIX International Co., Ltd., Hsinchu (TW)

(72) Inventors: Ya-Jui Lee, Taichung (TW); Kuan-Fu Chen, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 3 days.

(21) Appl. No.: 17/493,475

(22) Filed: Oct. 4, 2021

(65) Prior Publication Data

US 2023/0104982 A1   Apr. 6, 2023

(51) Int. Cl.
*G11C 16/16*   (2006.01)

(52) U.S. Cl.
CPC .................... *G11C 16/16* (2013.01)

(58) Field of Classification Search
CPC ..... G11C 16/16; G11C 16/0483; G11C 16/08; G11C 16/14; G11C 16/24; G11C 16/32; G11C 16/3436; G11C 16/344; G11C 16/3472; G11C 16/3477; G11C 16/3445; G11C 16/345
See application file for complete search history.

(56) References Cited

U.S. PATENT DOCUMENTS

| | | | | |
|---|---|---|---|---|
| 8,767,466 B2 * | 7/2014 | Asaoka | ............... | G11C 16/0483 365/185.17 |
| 9,824,765 B2 * | 11/2017 | Park | ..................... | G11C 16/32 |
| 9,830,963 B1 * | 11/2017 | Pang | ..................... | G11C 7/062 |
| 10,892,017 B2 * | 1/2021 | Nam | ..................... | G11C 16/14 |
| 11,574,690 B2 * | 2/2023 | Prakash | ............. | G11C 16/3445 |
| 2020/0211652 A1 * | 7/2020 | Wu | ........................ | G11C 7/04 |

\* cited by examiner

*Primary Examiner* — Donald H B Braswell
(74) *Attorney, Agent, or Firm* — J.C. PATENTS

(57) ABSTRACT

A flash memory and an erase method thereof are provided. The flash memory includes at least a memory array and a memory control circuit. The memory control circuit biases plural word lines, a common source line and a global bit line included in the memory array to erase plural memory cells in the flash memory. The method comprises grouping the plural word lines into plural word line groups according to erase depths corresponding to each word line; generating an erase voltage and plural multiple-step word line erase voltages; applying the erase voltage from at least one of the common source line and the global bit line; and during a period when the erase voltage is applied, the plural multiple-step word line erase voltages is respectively applied to the plural word line groups, wherein the plural multiple-step word line erase voltages is one-by-one corresponding to the plural word line groups.

16 Claims, 8 Drawing Sheets

FLASH MEMORY AND ERASE METHOD THEREOF

BACKGROUND

Technical Field

The present invention relates to a flash memory operation method, and particularly relates to a flash memory and an erasing method thereof.

Description of Related Art

Recently, the development of flash memory provides transition from two-dimensional structure (2D) to three-dimensional structure (3D), which brings a larger memory cell size and gate-all-around (GAA) cylindrical structures. Compared with 2D NAND flash memory, the reliability is significantly improved. The reliability of 3D NAND flash memory depends on many factors. Most of the factors are related to the process-induced variability of each layer. Indexes such as endurance, data retention capability, and cross-temperature immunity will be affected by these variations. Without the aid of system-level solutions, reliability challenges that are difficult to be tackled.

Erase depth control is very important for 3D NAND flash memory structure. Because of etching ability limitation for vertical channel (VC), the vertical channel will have a large variation along the word line in the vertical direction with respect to the substrate, also resulting in a variation in the erasure speed. This will impact on many device performances, such as retention, read distribution, endurance. Therefore, how to improve the erasure depth variation through operation compensation will be an issue for 3D NAND flash memory.

FIG. 1A is a schematic diagram showing the waveform of the word line erase voltage according to the existing method. As shown in FIG. 1A, the existing erase operation is to apply the same word line erase voltage to all the word lines during the common source line erase voltage applied to the common source line (CSL). In the 3D NAND flash memory, the word lines are arranged along the vertical direction. During the erase operation, the erase operation is performed by the voltage difference between the source and the gate (that is, the erase electric field), and finally the erase depth variation will reflect the profile of the vertical channel. In general, since the vertical channel is formed by etching, the more towards the lower side, the narrower the profile.

Therefore, the closer the word line to the top side, the slower the erase speed, and therefore, the devices erase depth is shallower. In contrast, the closer the word line to the lower side, the faster the erasing speed, and therefore, the erase depth is deeper. As a result, as shown in FIG. 1B, it illustrates a schematic diagram of the distribution of the erase depth to the word lines after the erase operation. As shown in FIG. 1, as the word lines are closer to the top side, the erasure depth becomes shallower. Therefore, as shown in FIG. 1B, the existing erase operation will result in that the erase depth has large variation along the arrangement direction of the word lines, that is, the erase depth is not uniform. This result will have a great impact on data retention, read distribution and other indexes.

Usually NAND flash memory (3D or 2D) is erased in units of blocks. Here, FIG. 1C and a single level cell (SLC) that stores one bit are used to briefly explain the concept of erasure depth. As shown in FIG. 1C, when erase is performed, the memory cell that has been programmed to the "0" state is erased to the "1" state. Taking the erase operation for 3D NAND flash memory as an example, the threshold voltage VT distribution of the final erase state "1" each word line will also be different. As shown in FIG. 1C, the threshold voltage VT distribution after a certain word line is erased may be relatively negative (as shown by the dotted line), which means that the erase depth is deeper. As a result, after the erase operation, the threshold voltage VT distribution may be too wide, which will have a great impact on data retention and read distribution and other indicators. Therefore, there are needs to make the threshold voltage VT distributions more tighten.

Therefore, how to control the erase depth more evenly, that is, the threshold voltage distributions are tighten, is an issue topic in this art. Therefore, it is necessary to develop a method to improve the uneven distribution of the erase depth for each word line.

SUMMARY

According to one embodiment, an erase method for a flash memory is provided. The flash memory includes at least a memory array and a memory control circuit. The memory control circuit biases a plurality of word lines, a common source line and a global bit line included in the memory array to erase a plurality of memory cells in the flash memory. The erase method comprises grouping the plurality of word lines into a plurality of word line groups according to erase depths corresponding to each of the plurality of word lines; generating an erase voltage and a plurality of multiple-step word line erase voltages; applying the erase voltage from at least one of the common source line and the global bit line; and during a period when the erase voltage is applied, the plurality of multiple-step word line erase voltages is respectively applied to the plurality of word line groups, wherein the plurality of multiple-step word line erase voltages is one-by-one corresponding to the plurality of word line groups.

According to another embodiment, a flash memory is provided, and comprises a memory array that includes at least a plurality of memory cells, a plurality of word lines, a common source line and a bit line, and by biasing plurality of word lines, the common source line and the bit line, the plurality of memory cells is operated; and a memory control circuit for controlling the memory array. The memory control circuit further performs an erase operation, including: grouping the plurality of word lines into a plurality of word line groups according to erase depths corresponding to each of the plurality of word lines; generating an erase voltage and a plurality of multiple-step word line erase voltages; applying the erase voltage from at least one of the common source line and the global bit line; and during a period when the erase voltage is applied, the plurality of multiple-step word line erase voltages is respectively applied to the plurality of word line groups, wherein the plurality of multiple-step word line erase voltages is one-by-one corresponding to the plurality of word line groups.

According to an embodiment, in the erase method or the flash memory described above, the deeper the erase depth of each of the word line groups, the shorter the time that applies a first step of a corresponding multiple-step word line erase voltages among the plurality of multiple-step word line erase.

According to an embodiment, in the erase method or the flash memory described above, a voltage value of each corresponding step of each of the plurality of multiple-step word line erase voltages is the same, but with a different application time. In addition, according to an embodiment, in the erase method or the flash memory, a voltage value of each corresponding step of each of the plurality of multiple-step word line erase voltages is different, but with a different application time.

According to an embodiment, in the erase method or the flash memory described above, the word lines in the plurality of word line groups may be continuously numbered. In addition, the word lines in the plurality of word line groups may be not continuously numbered.

According to an embodiment, in the erase method or the flash memory described above, each step of each of the plurality of multiple-step word line erase voltage is increased step by step.

According to an embodiment, in the erase method or flash memory described above, the flash memory is a 3D NAND flash memory or a 2D NAND flash memory.

According to one embodiment, in the erase method or the flash memory described above, the plurality of memory cells is a single-layer cell (SLC), a triple-level cell (TLC), a quad-level cell (QLC) or a multiple-level cell (MLC).

Based on the above embodiment, when the erase is performed, the word line erase voltage applied to each word line group is a voltage with 2-step (or more steps). The grouping for the word lines is based on the erase depth (or profile of vertical channel, etc.). By adjusting the application time of the first step of the word line erase voltage (the time for the first step being transient to the second step), the erase depth of each word line group can be controlled. In this way, after the flash memory is erased, the overall erase depth can be distributed more uniformly, and many device performances, such as retention, read distribution, durability, etc., can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

According to the concept of the embodiment of the present invention, the word lines are grouped according to the erase depth, and during a period that the erase voltage (common source line erase voltage in the following description) is applied, a multiple-step word line erase voltage is applied to each word line group, and in this way, the erase depth of each word line group can be adjusted so that the erase depth of each word line can be distributed more evenly. In other words, the word line erase voltage can be used to control the erase speed.

In the following descriptions, a 3D NAND flash memory will be used as an example, but not limited thereto. In addition, the word line erase voltage applied to each group is two-step as an example, but the present invention is not limited to this, and the steps can be adjusted arbitrarily.

Figure 1A:
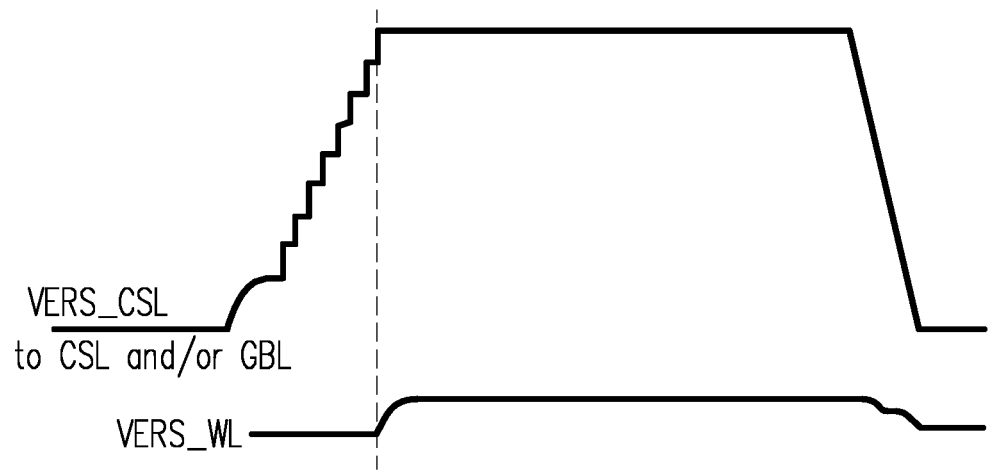
FIG. 1A is a schematic diagram of the waveform of the word line erase voltage according to the existing method.
Figure 1B:
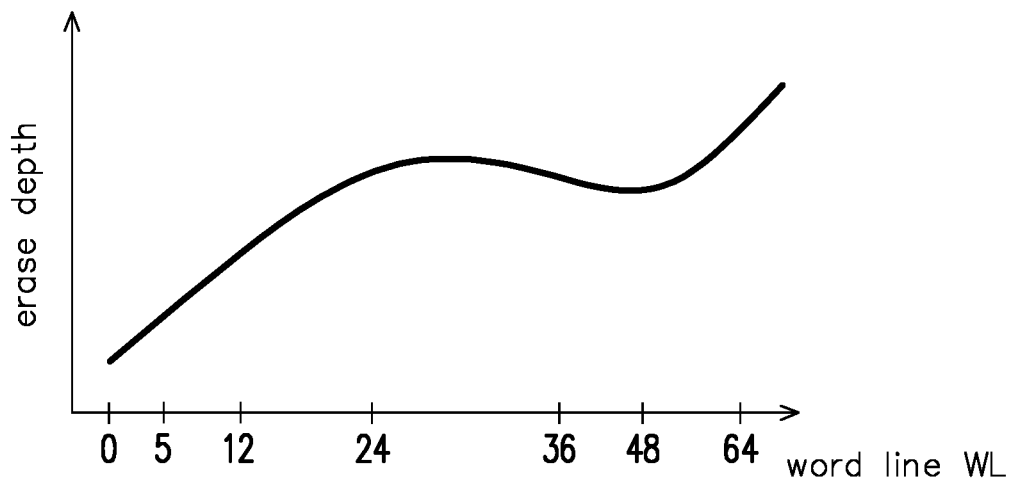
FIG. 1B is a schematic diagram of the distribution of the erase depth to the word line after the erase operation according to the existing method.
Figure 1C:
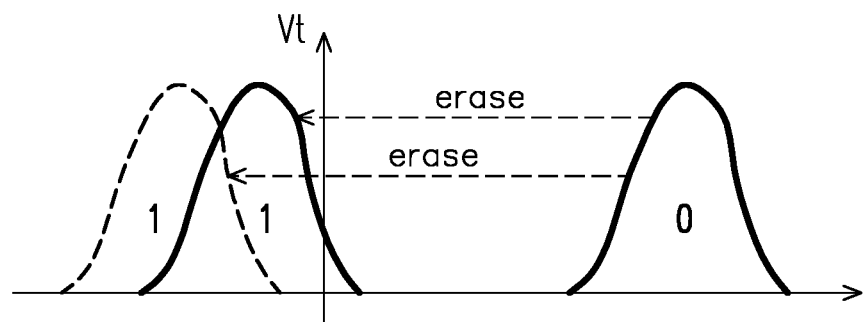
FIG. 1C is a diagram for explaining the erasure depth.
Figure 2:
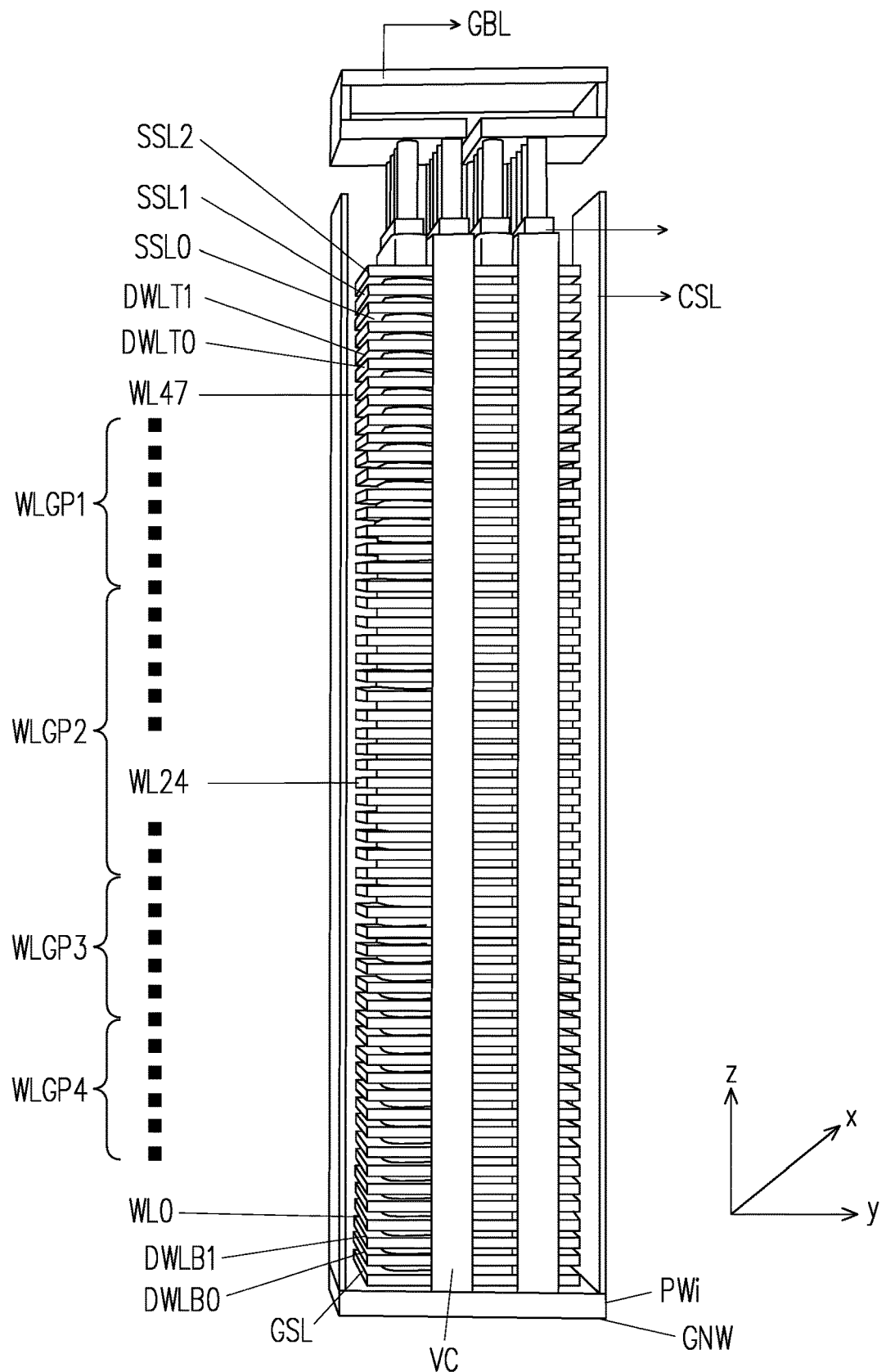
FIG. 2 is a schematic diagram showing the structure of a part of the word line of a 3D NAND flash memory.

FIG. 2 shows a memory structure as an application example of the embodiment of the present invention, which illustrates a partial structure of the 3D NAND flash memory. The schematic structure of the 3D NAND flash memory shown in FIG. 2 has plural word lines WL0~WL47 (48 as an example) formed in the vertical direction z, and the vertical channel VC is also along the vertical direction z is formed. Each word line extends on the xy plane. The width of the vertical channel VC intersecting a particular word line can be regarded as the size of the vertical channel VC for the particular word line. In general, the vertical channel VC is generally formed, for example, by etching, and therefore essentially has a size (width) variation in the vertical direction z along which the word lines are arranged (numbered). In other words, from the word line WL47 (top side) to the word line WL0 (lower side), the size of the vertical channel VC will become narrower and narrower. Namely, the sizes of the vertical channel corresponding to each of the word lines are not consistent and have variation. Therefore, when the 3D NAND flash memory is erased, the erase depth for each word line will also vary.

In addition, in the structure shown in FIG. 2, a certain number of lower dummy word lines, such as dummy word lines DWLB1, D WLB0, and so on can be formed under the word line WL0. Similarly, a certain number of top dummy word lines, such as dummy word lines DWLT1, DWLT0, and so on can be formed above the word line WL47. In addition, the 3D NAND flash memory may also include a common source line (CSL), and the common source line connects the source lines together. The 3D NAND flash memory may also include selection lines SSL0, SSL1, SSL2, etc. The 3D NAND flash memory can also form a global source line (GSL) at the lower side, and a global bit line (GBL) can be formed at the top side of the 3D NAND flash to connects the bit lines. The 3D NAND flash memory structure shown in FIG. 2 is only for understanding the relationship between the word line and the vertical channel VC, and is not intended to limit the implementation object of the present invention. The erase method of the invention can be applied to various 3D NAND flash memory structures.

During performing the erase operation on the 3D NAND flash memory, a common source line erase voltage (erase bias) VERS_CSL is applied from the common source line (CSL). At the same time, during the period when the common source line erase voltage VERS_CSL is applied, each word line is applied with the word line erase voltage VERS_WL, so as to erase the memory cells on the word lines. According to the embodiment of the present invention, in order to address uneven erase depth, the word line erase voltage VERS_WL applied to each word line is not completely the same. In this embodiment, a plurality of word lines is grouped first, and the grouping can be performed according to the erase depth. In addition, in order to control the erase speed, this embodiment uses a multiple-step word line erase voltage.

According to an embodiment of the present invention, for convenience, the plurality of word lines in the 3D NAND are divided into 4 groups, i.e., WLGP1, WLGP2, WLGP3, and WLGP4, and the number of word lines in each group is equal. However, the present invention is not limited to this. The plurality of word lines can be also divided into 5 groups or more, and the number of word lines in each group can be different, which can be adjusted appropriately according to the erase depth.

As shown in FIG. 2, 48 word lines WL0 to WL17 are illustrated in the embodiment. First, the word lines WL0~WL47 are divided into 4 groups, in which the first word line group WLGP1 includes the word lines WL36~WL47, the second word line group WLGP2 includes the word lines WL24~WL35, the third word line group includes the word lines WL12~WL23 and the fourth word line group WLGP4 includes the word lines WL0~WL11. Because the grouping in this embodiment is performed in a way that the number of the word lines in each group is equal, each of the first to the fourth word line groups WLGP1 to WLGP4 includes 12 word lines. In addition, in this embodiment, the 4 word line groups are grouped in a sequential manner, i.e., the word line WL0 at the lower side to the word line WL47 at the top side are equally and sequentially divided (grouped) to 4 groups.

According to the above description, the lower the word line, the faster the corresponding erase speed, and the deeper the erase; conversely, the topper the word line, the slower the corresponding erase speed, and the shallower the erase depth. Therefore, the erase depth corresponding to the first word line group WLGP1 is the shallowest and the erase speed is the slowest. The erase depth corresponding to the fourth word line group WLGP4 is the deepest and the erase speed is the fastest. Therefore, for the erase depth, there is the following relationship:

WLGP1<WLGP2<WLGP3<WLGP4 (erase depth)

For the erase speed, there is the following relationship:

WLGP1<WLGP2<WLGP3<WLGP4 (erase speed).

According to the embodiment of the present invention, in order to control the corresponding erase depths for each word line group, the word line erase voltage VERS_WL having the same waveform is no longer applied to each word line group, but each of the word line groups WLGP1~WLGP4 is respectively applied with a word line erase voltage VERS_WL with a different waveform. Here, the word line erase voltage VERS_WL adopts a multiple-step voltage waveform. The multiple-step voltage waveform can be at least two steps, but can be set to more steps according to the requirement. In this way, the erase depths corresponding to each of the word line groups can be controlled more finely, and the distribution of erase depths can be made more uniform. Hereinafter, this embodiment will take the 2-step word line erase voltage as an example.

Figure 3A:
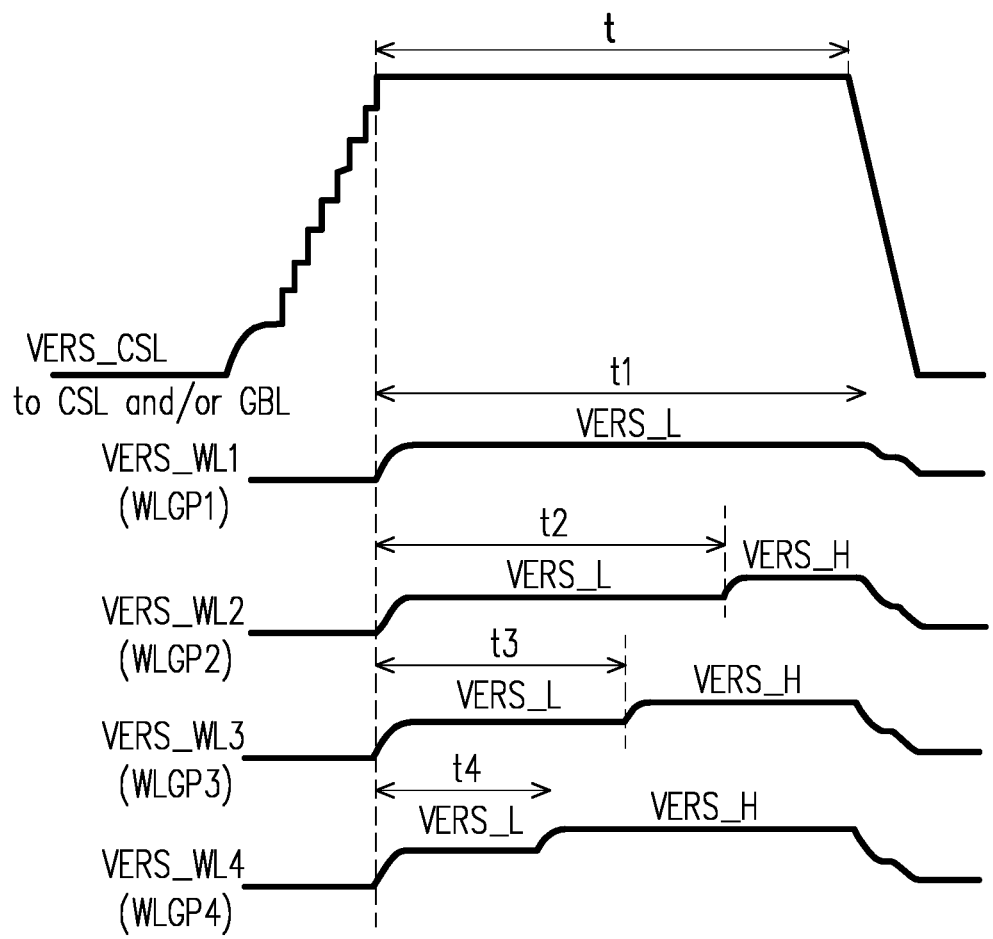
FIG. 3A is a schematic diagram showing the waveform of the word line erase voltage according to an embodiment of the present invention.

FIG. 3A is a schematic diagram showing the waveform of the word line erase voltage according to an embodiment of the present invention. As shown in FIG. 3A, the top waveform is the common source line erase voltage VERS_CSL applied to the common source line CSL, the following four waveforms are the word line erase voltages VERS_WL1 to VERS_WL4 respectively applied to the first to fourth word line groups WLGP1 to WLGP4. Each word line erase voltage VERS_WL1~VERS_WL4 includes two parts, namely a low level voltage VERS_L and a high level voltage VERS_H. In addition, the word line erase voltage may be 0-3V, for example. If the high level voltage VERS_H is set to 3V, the low level voltage VERS_L may be set to a value lower than 3V.

As shown in FIG. 3A, in the embodiment, the voltage values of the low level voltages VERS_L of the word line erase voltages VERS_WL1 to VERS_WL4 are basically the same, and the voltage values of the high level voltages VERS_H are basically the same. However, the application time of the low level voltage VERS_L for each of the word line erase voltages VERS_WL1~VERS_WL4 is different, which are t1, t2, t3, and t4, respectively. Take the word line erase voltage VERS_WL2 as an example. During the application time of the word line erase voltage VERS_WL2, after the low level voltage VERS_L is applied for a time period t2, the word line erase voltage VERS_WL2 is transient to the high level voltage VERS_H. Similarly, during the application time of the word line erase voltage VERS_WL3, after the low level voltage VERS_L is applied for a time period t3, the word line erase voltage VERS_WL3 is transient to the high level voltage VERS_H. During the application time of the word line erase voltage VERS_WL4, after the low level voltage VERS_L is applied for a time period t4, the word line erase voltage VERS_WL4 is transient to the high level voltage VERS_H. In addition, during the application time of the word line erase voltage VERS_WL1, because the corresponding erase depth is the shallowest and the erase speed is the slowest, there is no need to decelerate the erase speed of the first word line group WLGP1. Therefore, the low level voltage VERS_L of the word line erase voltage VERS_WL1 is continuously applied to the first word line group WLGP1 for a time period t1 (i.e., the application time t for the common source line erase voltage VERS_CSL) without being transient to the high level voltage VERS_H.

As mentioned above, the fourth word line group WLGP4 has the fastest erase speed, and the first word line group WLGP1 has the slowest erase speed. Therefore, if the erase speed of all word lines WL0~WL47 is to be distributed more evenly, the faster erase speeds have to be deaccelerated.

By controlling the waveforms of the word line erase voltages VERS_WL1~VERS_WL4 above, the erase speeds can be controlled. The erase speed of the fourth word line group WLGP4 needs to be decelerated earlier, and then the erase speed of the third word line group WLGP3 and the erase speed of the second word line group WLGP2 are sequentially deaccelerated. Furthermore, since the erase speed of the first word line group WLGP1 is the slowest, there is no need to be deaccelerated. In order to control the erase speed, the low level voltage VERS_L must be transient to the high level voltage VERS_H as soon as possible to decelerate the erase speed. Therefore, for the fourth word line group WLGP4, the application time t4 of the low level voltage VERS_L is the shortest, that is, the low level voltage VERS_L is first transient to the high level voltage VERS_H among all the word line groups WLGP1~WLGP4. In other words, the application time of the low level voltage VERS_L for each word line group WLGP1~WLGP4 satisfies the following relationship.

$$t4\ (WLGP4) < t3(WLGP3) < t2(WLGP1) < t1\ (WLGP1)$$

In addition, the total application time of the word line erase voltages VERS_WL1 to VERS_WL4 for each word line group WLGP1 to WLGP4 is the same, i.e., the same as the application time t of the common source line erase voltage VERS_CSL. Therefore, the application times for the high level voltage VERS_H for each of the word line groups WLGP1~WLGP4 are t-t1, t-t2, t-t3, and t-t4, which satisfy the following relationship.

$$t-t4(WLGP4) > t-t3(WLGP3) < t-t2(WLGP2) < t-t1 = 0\ (WLGP1)$$

Therefore, as described above, by controlling the waveforms of the word line erase voltages VERS_WL1~VERS_WL4, i.e., by controlling the application times of the low level voltages VERS_L of the word line erase voltages VERS_WL1~VERS_WL4 (the time point when the low level is transient to the high level), the erase depths can be effectively controlled.

For example, for the fourth word line group WLGP4, the erase depth is the deepest and the erase speed is the fastest, and therefore, the low level voltage VERS_L of the word line erase voltage VERS_WL4 is first transient to the high level voltage VERS_H. In this way, the erase speed can be decelerated at the earliest time, i.e., the degree of deceleration is the greatest. In addition, for the first word line group WLGP1, the erase depth is the shallowest and the erase speed is the slowest, and therefore, the low level voltage VERS_L of the word line erase voltage VERS_WL1 is continuously applied during the application time of the word line erase voltage VERS_WL1 without being transient to high level voltage VERS_H. Namely, the application time for the high level voltage VERS_H of the word line erase voltage VERS_WL1 is 0 (t-t1=0).

Figure 3B:
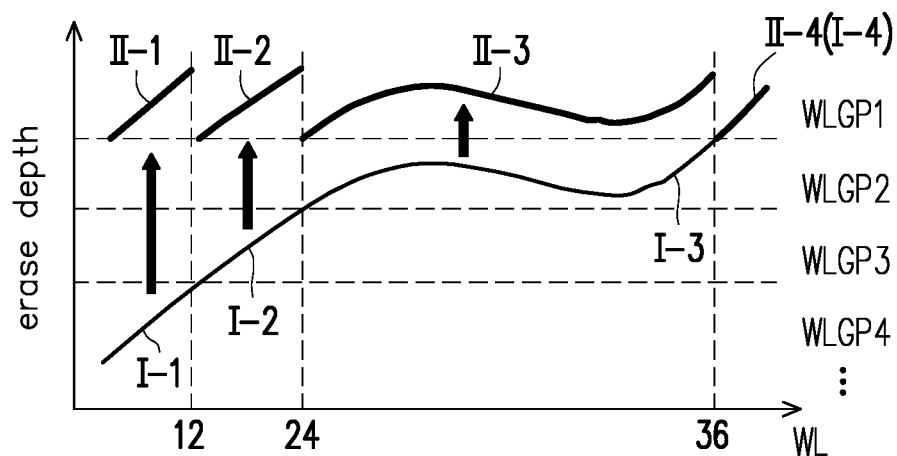
FIG. 3B is a schematic diagram showing the distribution of the erase depth to the word line after an erase operation according to an embodiment of the present invention.

FIG. 3B is a schematic diagram showing the distribution of the erase depths to the word line after the erase operation according to an embodiment of the present invention. As shown in FIG. 3B, after applying the word line erase voltages VERS_WL1~VERS_WL4 as shown in FIG. 3A to each word line group WLGP1, WLGP2, WLGP3, and WLGP4, the erase depths for each of word line group WLGP1, WLGP2, WLGP3, and WLGP4 becomes substantially consistent (uniform). For example, the erase depth of the fourth word line group WLGP4 is shifted from the erase depth area I-4 (using the existing erase operation) to a shallower erase depth area II-4. Similarly, the erase depth of the third word line group is shifted from the erase depth area I-3 (using the existing erase operation) to the shallower erase depth area II-3, and the erase depth of the second word line group WLGP2 is shifted from the erase depth area I-2 (using the existing erase operation) to the erase depth area II-2. In addition, because the erase speed of the first word line group WLGP1 does not need to be decelerated, the erase depth is not changed.

As a result, it can be seen that after the word lines are grouped according to the embodiment of the present invention, and the application time of each step of the corresponding word line erase voltage applied to each word line group is adjusted according to the erase depth, the distribution of the erase depths for each word line group gets to be consistent. In other words, the corresponding erase depths of the second to fourth word line groups WLGP2 to WLGP4 are adjusted to be consistent with the erase depth of the first word line group WLGP1. In this way, the erase depths of the first to fourth word line groups WLGP1 to WLGP4 become approximately in the same range, so a more uniform erase depth can be obtained.

Figure 4:
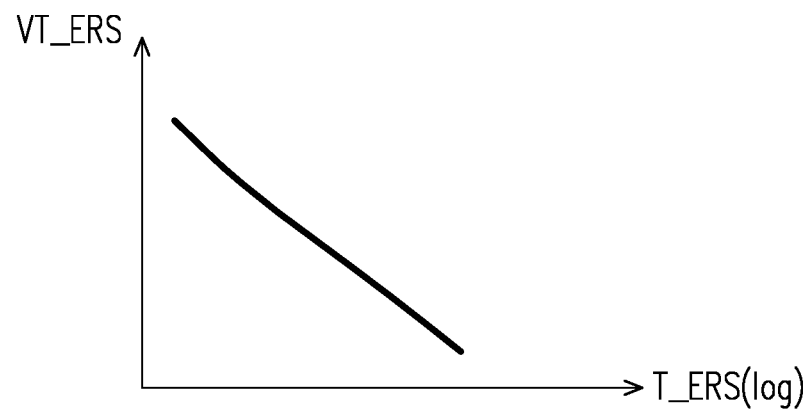
FIG. 4 shows the relationship between the erase time and the threshold voltage.

In addition, generally, the higher the common source line erase voltage, the deeper the erase depth and the faster the erase speed. In addition, in a case that the common source line erase voltage is the same, the longer the erase, the deeper the erase depth and the faster the erase speed. As shown in FIG. 4, the threshold voltage VT_ERS after the erase operation and the logarithm of the erase time T_ERS is substantially inversely proportional. Therefore, the change of the threshold voltage VT_ERS can be known by increasing or decreasing one time order. In other words, if the threshold voltage after erase should not be too negative, a target threshold voltage can be obtained from the above relationship, and then the erase time can be obtained.

Next, the criterion for the word line grouping is further explained. In the above example, the vertical channel is described with a narrower profile as it goes down. Taking the example of FIG. 2, the width (size) of the vertical channel VC at the word line WL47 is larger, and the width of the vertical channel VC becomes narrower as it goes down, and the vertical channel VC at the word line WL0 (the lower side) is the narrowest. Therefore, in this case, the distribution of the erase depth will also correspond to the profile of the vertical channel VC. In the above grouping example, all the word lines WL0 to WL47 are grouped by adjacent word lines from the top side to the lower side.

However, the profile of the vertical channel after etching does not necessarily show such a change. For example, the vertical channel can be a profile that is wider at the top and lower sides but narrower at the middle part, or any other possible profile. As mentioned above, the profile of the vertical channel will be reflected in the erase depth. Therefore, when grouping is performed, the word lines can be grouped according to the profile of the vertical channel contour (i.e., the erase depth). In other words, the word lines with similar profile of the vertical channel (similar erase depths) can be grouped into the same group. Similarly, the same common source line erase voltage waveform is applied to the word lines of the same group. Therefore, in this example, the grouping of the word lines does not follow the numbering of the word lines, but in a random manner.

Therefore, in addition to the above-mentioned embodiment where all the word lines are grouped sequentially and evenly (number is the same), but the word lines in the same group may also be not adjacent or not continuously numbered.

Figure 5:
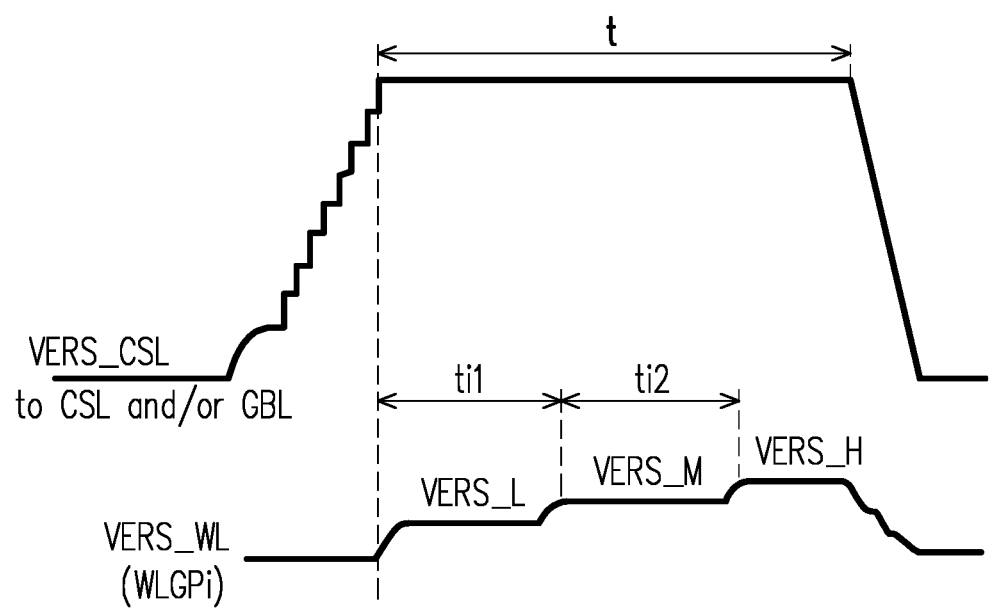
FIG. 5 is a schematic diagram showing the waveform of the word line erase voltage according to a variation of the embodiment of the present invention.

FIG. 5 is a schematic diagram showing the waveform of the word line erase voltage according to a variation of the embodiment of the present invention. In the above description, the waveform of the word line erase voltage uses a 2-step waveform as an example, and this variation is based on 3-step as an example. As shown in FIG. 5, similarly during the time period t that the common source line erase voltage VERS_CSL is applied, 3-step word line erase voltages VERS_WLi (corresponding to the i-th word line group WLGPi) are respectively applied to each word line group. Each 3-step word line erase voltage VERS_WLi may include a low level voltage VERS_L, a middle level voltage VERS_M, and a high level voltage VERS_H. The application time of the low level voltage VERS_L is, for example, ti1, the application time of the middle level voltage VERS_M is, for example, ti2, and the application time of the high level voltage VERS_H is, for example, t−ti1−ti2. In one embodiment, if the 3rd word line group WLGP3 has the slowest erase speed, then only the VERS_L is applied to the 3rd word line group WLGP3, and the time t31 is set to time t, time t32=0 and t−t31−t32=0, i.e., the middle level voltage VERS_M and the high level voltage VERS_H are not applied to the 3rd word line group WLGP3.

In this way, by controlling the time point when the low level voltage VERS_L is transient to the middle level voltage VERS_M and the time point when the middle level voltage VERS_L is transient to the high level voltage VERS_H, the corresponding erase speed for each word line group can be controlled more finely. Therefore, the erase depths of all word lines can be more finely controlled and more evenly distributed, i.e., the erase depth can be compensated more accurately.

In summary, the deeper the erase depth of each group among the word line groups, the shorter the application time of a first step voltage of a corresponding multiple-step word line erase voltages among the multiple-step word line erase voltages. In other words, as shown in FIG. 3A, the corresponding erase depth of the fourth word line group WLGP4 is the deepest, so the application time t4 of its first step voltage (low level voltage VERS_L in the 2-step word line erase voltage) is the shortest.

In addition, the voltage values of the corresponding steps of the multiple-step word line erase voltages VERS_WL1 to VERS_WL4 may be the same or different, but the application time is different. In the above example, the low level voltage VERS_L of each 2-step word line erase voltages VERS_WL1~VERS_WL4 are the same, and the high level voltages VERS_H are also the same, but the application times t1~t4 are different. In addition, the low level voltage VERS_L of each 2-step word line erase voltage VERS_WL1~VERS_WL4 can be set to be different, and the high level voltage VERS_H can also be set to be different. In this way, the compensation of the erase depth can be controlled more finely.

Figure 6A:
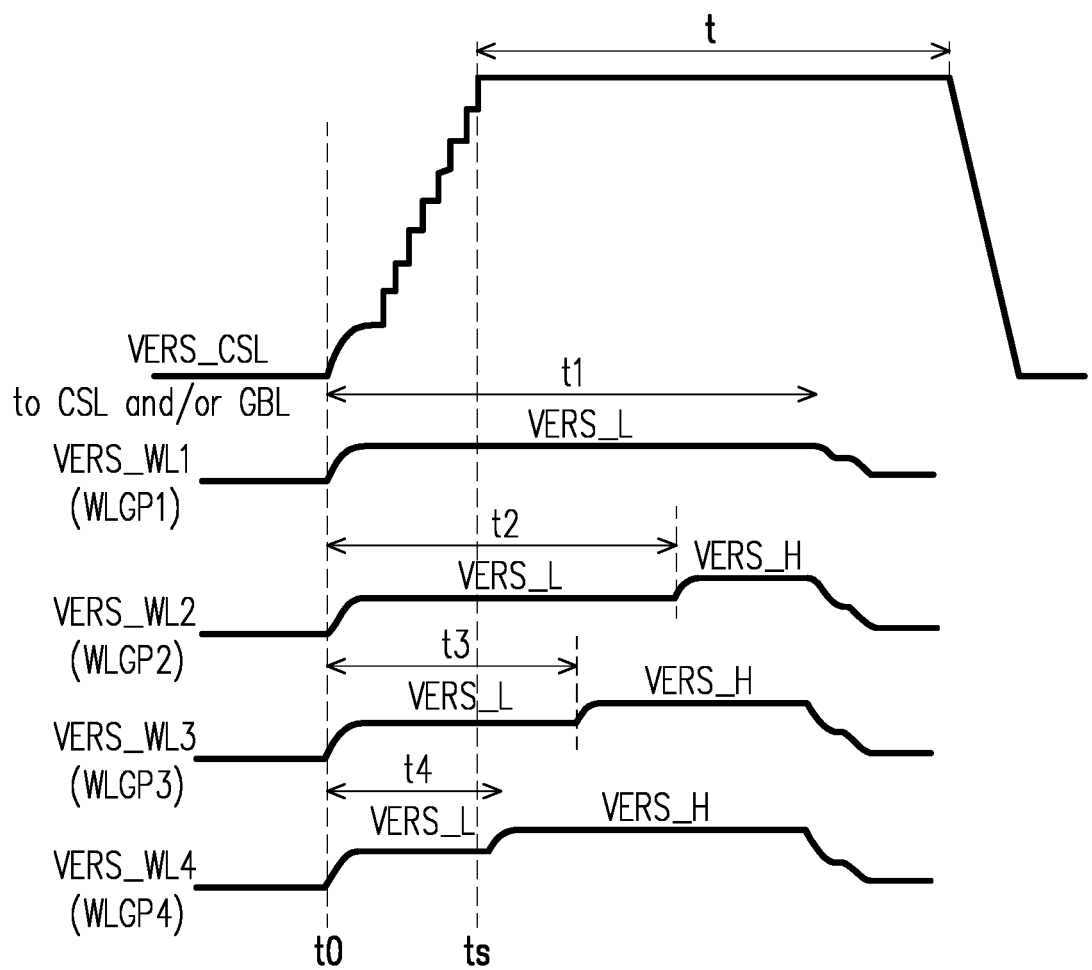
FIG. 6A is a schematic diagram showing the waveform of the word line erase voltage according to a variation of the embodiment of the present invention.
Figure 6B:
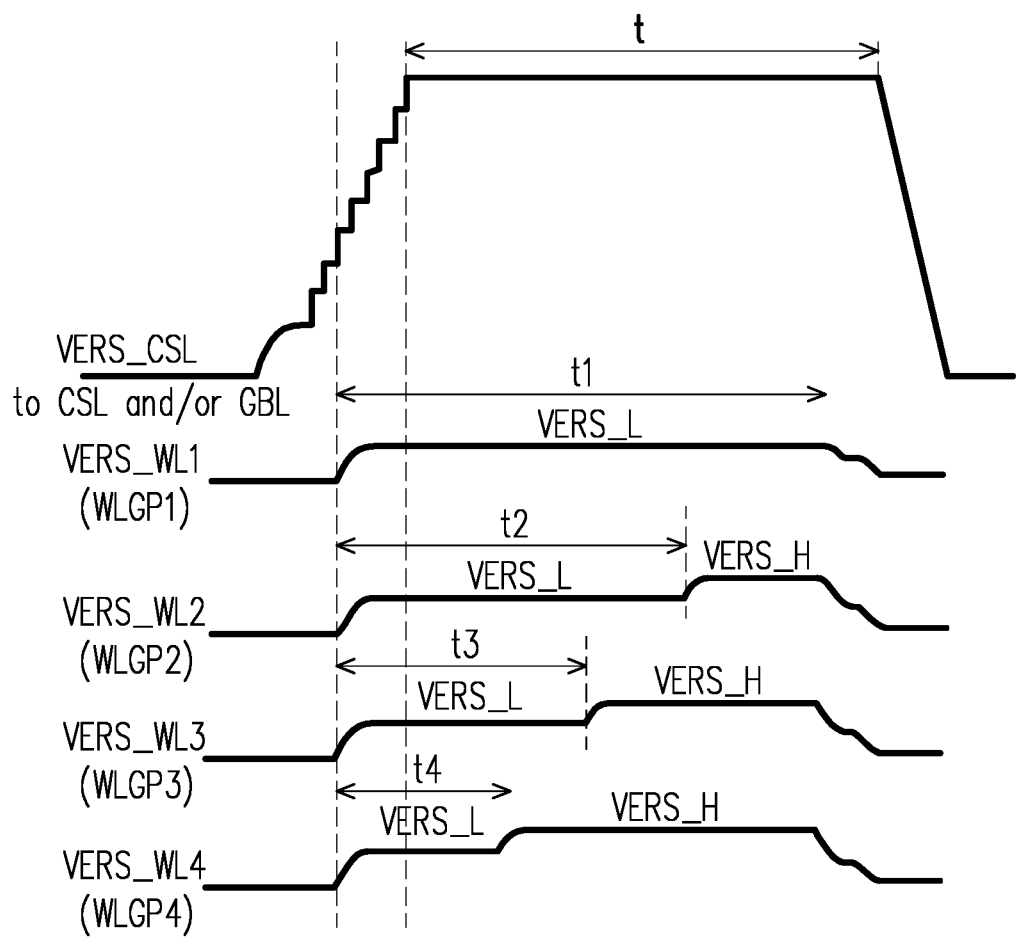
FIG. 6B is a schematic diagram showing the waveform of the word line erase voltage according to a variation of the embodiment of the present invention.
Figure 6C:
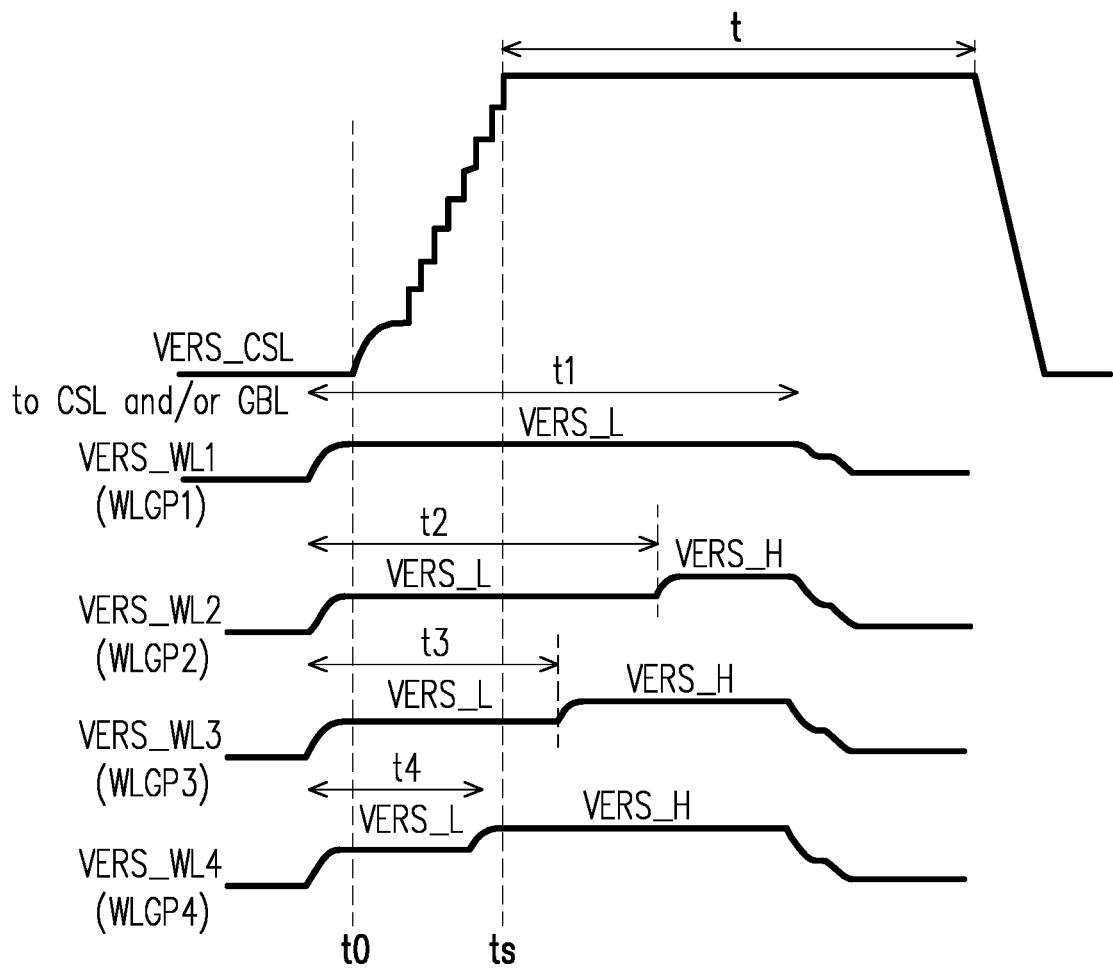
FIG. 6C is a schematic diagram showing the waveform of the word line erase voltage according to a variation of the embodiment of the present invention.

FIGS. 6A to 6C are schematic diagrams showing waveforms of the word line erase voltage according to a variation of the embodiment of the present invention. In the example described above, the time point when the word line erase voltage VERS_WL is applied is when the common source line erase voltage VERS_CSL rises to a stable voltage value, however, the application period of the common source line erase voltage VERS_CSL referred to in the embodiment of the present invention may also include at least the following situations.

As shown in FIG. 6A, the time point of applying the word line erase voltage VERS_WL can be at the time point time t0 when the common source line erase voltage VERS_CSL starts rising. As shown in FIG. 6B, the time point of applying the word line erase voltage VERS_WL can be any time point from the time t0 when the common source line erase voltage VERS_CSL starts rising to a time point (ts) when the common source line erase voltage VERS_CSL becomes a stable voltage value. That is, the time point when the word line erase voltage VERS_WL is applied is between the time t0~ts shown in FIG. 5A. In addition, As shown in FIG. 6C, the time point of applying the word line erase voltage VERS_WL can be set earlier than the time point time t0 when the common source line erase voltage VERS_CSL starts rising.

In addition, in the above embodiments, as shown in FIG. 2, the common source line erase voltage is applied from the common source line CSL, i.e., the common source line erase voltage is applied from the bottom side, but the present invention is not limited to this example. For example, the erase voltage can also be applied from the global bit line GBL from the top side.

Furthermore, in addition to applying the erase voltage from one side (i.e., from the common source line CSL or from the global bit line GBL), it is also possible to apply the erase voltage from both sides (i.e., from the global bit line GBL side and the common source line CSL side). Namely, the erase voltage can be applied from at least one of the common source line CSL from bottom and the global bit line GBL from top. In addition, the waveform of the common source line erase voltage applied from the common source line CSL side and/or the global bit line GBL side may be the same.

Figure 7:
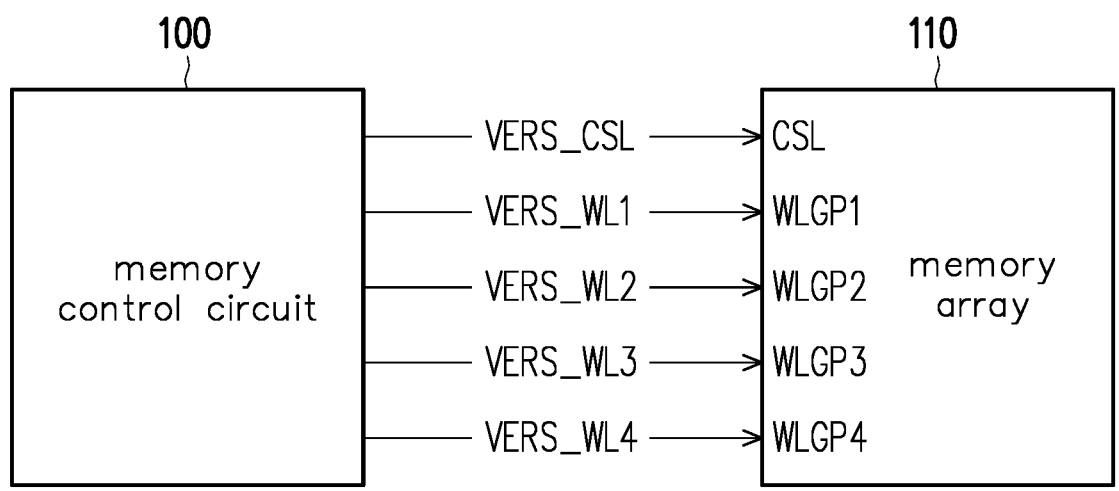
FIG. 7 is a block diagram of a control circuit of a flash memory according to an embodiment of the present invention.

FIG. 7 is a block diagram of a control circuit of a flash memory according to an embodiment of the present invention. FIG. 7 shows a simplified schematic diagram, regarding the actual circuit configuration and various functional blocks such as row decoders, column decoders, voltage generating circuits, various buffers, control logic, I/O circuits, etc., those skilled in the art can appropriately design according to their needs based on the concept of the present invention.

As shown in FIG. 7, the flash memory at least includes but is not limited to the memory control circuit 100 and the memory array 110. The memory array 100 includes at least a plurality of memory cells, a plurality of word lines, a common source line, and a bit line, and by applying voltages to the plurality of word lines, the common source line, and the bit line, the plurality of memory cells in the flash memory can be operated to read, program or erase. Here, the memory array 100 is not particularly limited. As mentioned above, the memory array 100 can be configured as a 3D or 2D NAND flash memory array.

The memory control circuit 100 is basically used to control all operations of the memory array 110, including reading, programming, erasing, and so on. Here, the part of the erase operation is specially explained, and the other operations such as reading and programming may be any existing operation method. As mentioned above, the memory control circuit 100 performs the erase operation to compensate for the influence caused by the uneven erasing depth. The memory control circuit 100 performs the grouping on the plurality of word lines to obtain word line groups WLGP1 to WLGP4 according to the erase depth corresponding to each of the plurality of word lines. Here, four word line groups are taken as an example.

The memory control circuit 100 generates a common source line erase voltage VERS_CSL and a plurality of multiple-step word line erase voltages. Here, four 2-step word line erase voltages VERS_WL1 to VERS_WL4 corresponding to the four word line groups WLGP1 to WLGP4 are taken as examples. In addition, as long as the technical effects of the invention can be achieved, the memory control circuit 100 generates the common source line erase voltage VERS_CSL and the plurality of multiple-step word line erase voltages VERS_WL1~VERS_WL4 can adopt various methods and circuit structures, and the invention is not particularly limited. The common source line erase voltage VERS_CSL is applied to the common source line CSL, and during the period when the common source line erase voltage VERS_CSL is applied, the plurality of multiple-step word line erase voltages VERS_WL1 VERS_WL4 are respectively applied to each word line group WLGP1 WLGP4 in a one-to-one manner.

Here, the grouping for the word lines, the waveform and the application times of the multiple-step word line erasing voltages, etc., can be referred to the above detailed description.

The above embodiment takes the 3D NAND flash memory as an example, but the present invention is not limited to NAND flash memory, and other types of memory can also be applied. In addition, in addition to the 3D flash memory, the erase operation method of the present invention can also be applied to the 2D NAND flash memory. That is, if there is a problem of inconsistent erase depth, the word lines of the 2D NAND flash memory can also be grouped, and the grouping method is the same as the above-mentioned embodiment and its variants.

In addition, the erase method of the present invention is not only suitable for 2D or 3D memory, it can also be applied to the memory cells configured to a single-level cell (SLC) that stores 1 bit, a two-level cell that stores 2 bits, a triple-level cell (TLC) that stores 4 bits, a quad-level cell (QLC) that stores 4 bits, or a multiple-level cell (MLC).

In summary, according to the embodiment of the present invention, when the erase is performed, the word line erase voltage applied to each word line group is a 2-step (or more steps) voltage. In other words, for example, the first step of the word line erase voltage VERS_L is applied to one word line group, and then the second step of the word line erase voltage VERS_H is applied immediately. Here, the first step VERS_L of the word line erase voltage VERS_WL of is smaller than the second step VERS_H of the word line erase voltage VERS_WL. In addition, the total application time of the 2-step (or more steps) word line erase voltage applied to each word line group is the same, i.e., equal to the application time t of the common source line erase voltage applied to the common source line. Therefore, for each word line group, the longer the time for applying the first step VERS_L of the word line erase voltage, the shorter the time for applying the second step VERS_H of the word line erase voltage. By adjusting the period of time for applying the first step VERS_L of the word line erase, the erase depth of each word line group can be controlled. In this way, after the flash memory is erased, the overall erase depth can be distributed more uniformly, and many device performances, such as retention, read distribution, durability, etc., can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An erase method for a flash memory, the flash memory including at least one memory array and a memory control circuit, the memory control circuit biasing a plurality of word lines, a common source line and a global bit line to erase a plurality of memory cells in the at least one memory array, the erase method comprising:
   grouping the plurality of word lines into a plurality of word line groups according to erase depths corresponding to each of the plurality of word lines, wherein the erase depths of the plurality of word lines include erase depth distributions, and the word lines belong a same erase depth distribution are grouped to a same word line group among the plurality of the word line groups;
   generating an erase voltage and a plurality of multiple-step word line erase voltages;
   applying the erase voltage from at least one of the common source line and the global bit line; and
   during a period when the erase voltage is applied, the plurality of multiple-step word line erase voltages is respectively applied to the plurality of word line groups, wherein the plurality of multiple-step word line erase voltages is respectively corresponding to the plurality of word line groups, and after erasing the flash memory the erase depth distributions of the plurality of word line groups become substantially in a same range,
   wherein the erase depths respectively represent threshold voltage distributions after erasing the flash memory, and
   the deeper the erase depth of each of the word line groups, the shorter the time that applies a first step of a corresponding multiple-step word line erase voltages among the plurality of multiple-step word line erase voltages.

2. The erase method according to claim 1, wherein a voltage value of each corresponding step of each of the plurality of multiple-step word line erase voltages is the same, but with a different application time.

3. The erase method according to claim 1, wherein a voltage value of each corresponding step of each of the plurality of multiple-step word line erase voltages is different, but with a different application time.

4. The erase method according to claim 1, wherein the word lines in the plurality of word line groups are continuously numbered.

5. The erase method according to claim 1, wherein the word lines in the plurality of word line groups are not continuously numbered.

6. The erase method according to claim 1, wherein each step of each of the plurality of multiple-step word line erase voltage is increased step by step.

7. The erase method according to claim 1, wherein the flash memory is a 3D NAND flash memory or a 2D NAND flash memory.

8. The erase method according to claim 1, wherein the plurality of memory cells is a single-layer cell (SLC), a triple-level cell (TLC), a quad-level cell (QLC) or a multiple-level cell (MLC).

9. A flash memory, comprising:
   a memory array that includes at least one plurality of memory cells, a plurality of word lines, a common source line and a global bit line, and by biasing the plurality of word lines, the common source line and the bit line, the plurality of memory cells is operated; and
   a memory control circuit for controlling the memory array,
   wherein the memory control circuit further performs an erase operation, including:
   grouping the plurality of word lines into a plurality of word line groups according to erase depths corresponding to each of the plurality of word lines wherein the erase depths of the plurality of word lines include erase depth distributions, and the word lines belong a same erase depth distribution are grouped to a same word line group among the plurality of the word line groups;
   generating an erase voltage and a plurality of multiple-step word line erase voltages;
   applying the erase voltage from at least the common source line and the global bit line; and
   during a period when the erase voltage is applied, the plurality of multiple-step word line erase voltages is respectively applied to the plurality of word line groups, wherein the plurality of multiple-step word line erase voltages is respectively corresponding to the plurality of word line groups, and after erasing the flash memory the erase depth distributions of the plurality of word line groups become substantially in a same range, wherein the erase depths respectively represent threshold voltage distributions after erasing the flash memory, and the deeper the erase depth of each of the word line groups, the shorter the time that applies a first step of a corresponding multiple-step word line erase voltages among the plurality of multiple-step word line erase voltages.

10. The flash memory according to claim 9, wherein a voltage value of each corresponding step of each of the plurality of multiple-step word line erase voltages is the same, but with a different application time.

11. The flash memory according to claim 9, wherein a voltage value of each corresponding step of each of the plurality of multiple-step word line erase voltages is different, but with a different application time.

12. The flash memory according to claim 9, wherein the word lines in the plurality of word line groups are continuously numbered.

13. The flash memory according to claim 9, wherein the word lines in the plurality of word line groups are not continuously numbered.

14. The flash memory according to claim 9, wherein each step of each of the plurality of multiple-step word line erase voltage is increased step by step.

15. The flash memory according to claim 9, wherein the flash memory is a 3D NAND flash memory or a 2D NAND flash memory.

16. The flash memory according to claim 9, wherein the plurality of memory cells is a single-layer cell (SLC), a triple-level cell (TLC), a quad-level cell (QLC) or a multiple-level cell (MLC).

* * * * *